United States Patent [19]

Ohashi

[11] Patent Number: 5,079,626
[45] Date of Patent: Jan. 7, 1992

[54] DIGITAL PICTURE IMAGE FORMING APPARATUS FOR ELIMINATING CROSS TALK BETWEEN A PLURALITY OF COLORS

[75] Inventor: Kunio Ohashi, Nara, Japan

[73] Assignee: Sharp Kabushiki Kaisha, Osaka, Japan

[21] Appl. No.: 407,925

[22] Filed: Sep. 15, 1989

[30] Foreign Application Priority Data

Sep. 19, 1988 [JP] Japan .................................. 63-234591

[51] Int. Cl.$^5$ ............................................. H04N 1/46
[52] U.S. Cl. ........................................... 358/75; 355/27
[58] Field of Search .................. 358/75, 80; 355/27, 355/84; 430/138

[56] References Cited

U.S. PATENT DOCUMENTS 4,624,560 11/1986 Beery ..................................... 355/27
4,932,068 6/1990 Sonoda ................................... 355/27
4,933,708 6/1990 Asano et al. ........................... 355/27

Primary Examiner—James J. Groody
Assistant Examiner—Kim Yen Vu

[57] ABSTRACT

A digital picture image forming apparatus is disclosed which includes a media sheet coated with micro-capsules, each of which contains one of the dyes capable of coloring to yellow, magenta and cyan and curable by irradiating to one of blue, green and red light. It further includes an optical system for irradiating to the media sheet a blue, green or red light including digital picture image information, to form latent images on the media sheet. Finally, a device for pressing an image receiving sheet on the irradiated media sheet and rupturing the uncured micro-capsules is included to form a picture image information on the image receiving sheet. Further the three colors of digital picture image information light do not contain cross talk wavelength ranges overlapping with each other.

5 Claims, 6 Drawing Sheets

| | Liquid crystal 24a: Yellow | Liquid crystal 24b: Magenta | Liquid crystal 24c: Cyan |
|---|---|---|---|
| 1 | No picture image | No picture image | Step wedge image |
| 2 | No picture image | Step wedge image | No picture image |
| 3 | Step wedge image | No picture image | No picture image |
| 4 | Step wedge image | Step wedge image | Step wedge image |

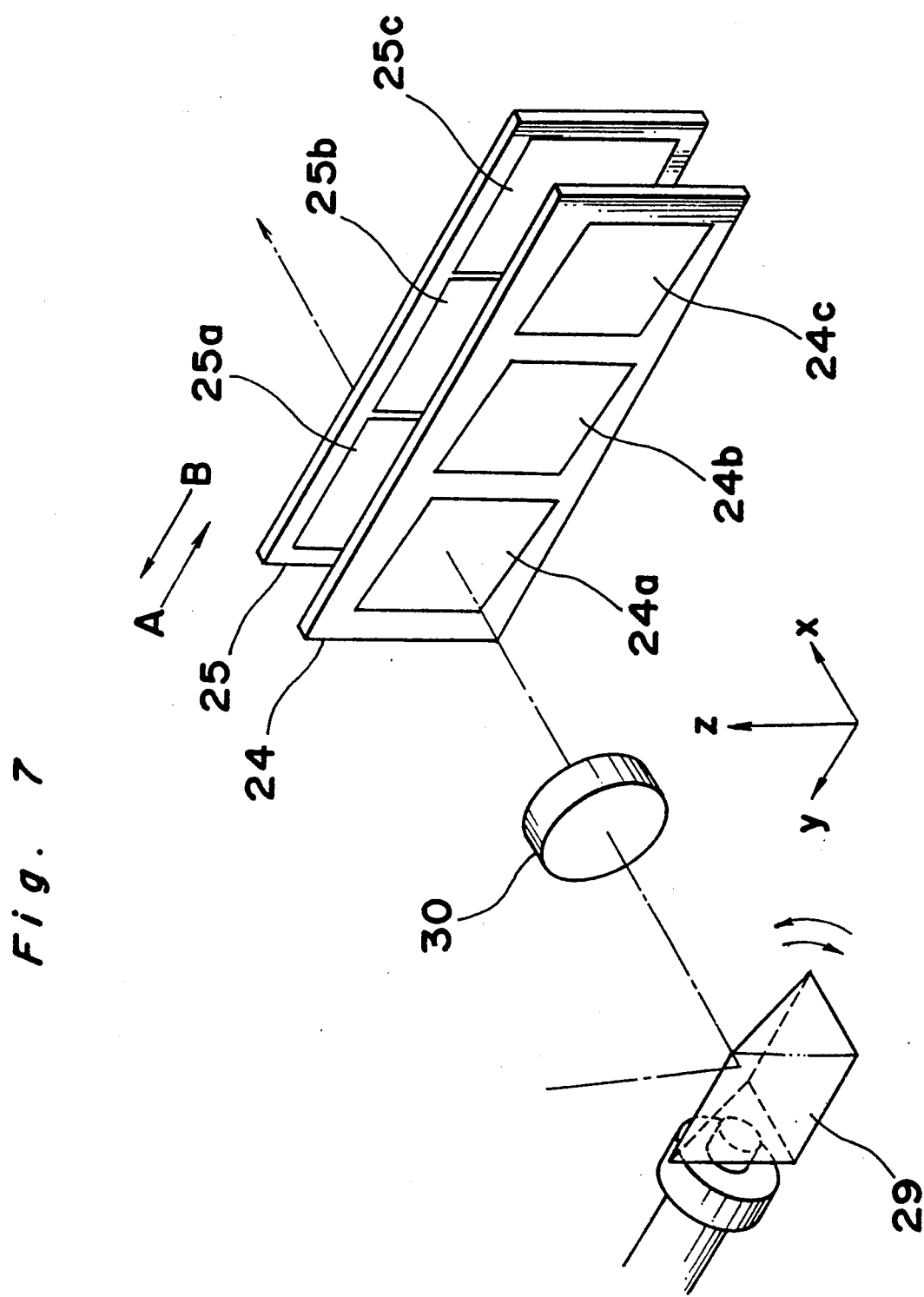

DIGITAL PICTURE IMAGE FORMING APPARATUS FOR ELIMINATING CROSS TALK BETWEEN A PLURALITY OF COLORS

FIELD OF THE INVENTION

The present invention relates to an improvement of the digital picture image forming apparatus.

BACKGROUND OF THE INVENTION

There is proposed a method for image-forming which uses a photosensitive media sheet having a pressure-sensitive property, and an image-receiving sheet so as to reproduce picture images on the image-receiving sheet, as disclosed in the Japanese Patent Publication (unexamined) No. 88739/1983. The media sheet is composed of a film coated with a dispersion of three kinds of micro-capsules, thereby being sensitive to all kinds of colors as disclosed in the Japanese Patent Publication (unexamined) No. 30537/1983. These three kinds of micro-capsules are:

(1) a Y micro-capsule containing a photo-curable ingredient sensitive to light within a blue wavelength range, and a colorless dye capable of coloring to yellow;

(2) an M micro-capsule containing a photo-curable ingredient sensitive to light within a green wavelength range, and a colorless dye capable of coloring to magenta; and (3) a C micro-capsule containing a photo-curable ingredient sensitive to light within a red wavelength range, and a colorless dye capable of coloring to cyan.

In this media sheet, each kind of micro-capsule is partially cured by exposure with picture image forming light within its own sensitive wavelength range. After the exposure, the media sheet and the image-receiving sheet are overlapped to each other at their active surfaces, under pressure, to crush the uncured micro-capsules, so that colored picture images can be reproduced on the image-receiving sheet.

There are two methods of exposing the media sheet sensitive to all kinds of colors, to picture image forming light. One is to simultaneously expose the media sheet to picture image forming light within a wavelength range of approximately 400 to 700 nm which includes red, green, and blue wavelength ranges, such as reflected light from a colored original document. The other is to successively expose the media sheet to the respective picture image forming light within a blue wavelength range of approximately 400 to 500 nm, within a green wavelength range of approximately 500 to 600 nm, and within a red wavelength range of approximately 600 to 700 nm, in accordance with the respective sensitivities of the Y, M, and C micro-capsules. In the method of the successive exposure, the digital picture image information which is read, for example, by an image scanner or the like can be printed as colored picture images. Such an example is given where the respective digital picture image information corresponding to yellow, magenta, and cyan are written to three liquid crystal plates, and a media sheet is first exposed only to light within a blue wavelength range transmitted through the liquid crystal panel to which the yellow picture image information is written, and then, exposed to the respective light transmitted through the liquid crystal panels to which the magenta, and the cyan picture image information are respectively written. The Y, M, and C micro-capsules on the media sheet are cured to form images corresponding to the digitized color picture image information.

It is to be noted that there arises a drawback that the densities of three primary colors of yellow, magenta, and cyan are decreased in the above mentioned three stepped exposure method. Furthermore, there occurs a severe difference in the characteristic curve between each of the reproduced primary colors and the reproduced neutral grey, which causes turbidity in the colors of the reproduced picture images. For this reason, the conventional digital picture image processing technique cannot reproduce color accurately.

SUMMARY OF THE INVENTION

The object of the present invention is therefore to provide a digital picture image forming apparatus which can improve the color reproduction of colored picture images. These and other objects of present invention are fulfilled by a digital picture image forming apparatus comprising (a) a media sheet coated with micro-capsules, each of which contains one of the dyes capable of coloring yellow, magenta and cyan and is cured by an irradiated to one of blue, green and red light, (b) an optical system, including a metal halide lamp, for irradiating to said media sheet a blue, green or red light, containing digital picture image information, to form latent images on said media sheet, (c) means for pressing an image receiving sheet on said irradiated media sheet and rupturing the uncured micro-capsules to form a picture image information on the image receiving sheet, wherein said red, green and blue color digital picture image information light do not contain cross talk overlapping wavelength ranges.

BRIEF DESCRIPTION OF THE DRAWINGS

FIG. 7 is an enlarged perspective view of the optical system of the above mentioned image forming apparatus.

DETAILED DESCRIPTION OF THE PREFERRED EMBODIMENTS OF THE PRESENT INVENTION

Figure 2:
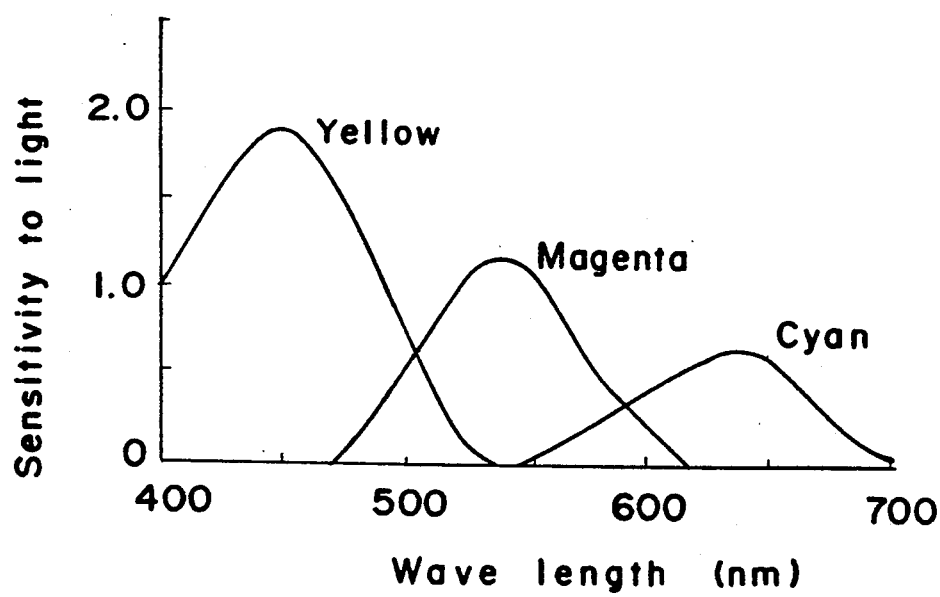
FIG. 2 is a graph which shows the spectral and sensitivity characteristics of the three kinds of micro-capsules on the media sheet.
Figure 3:
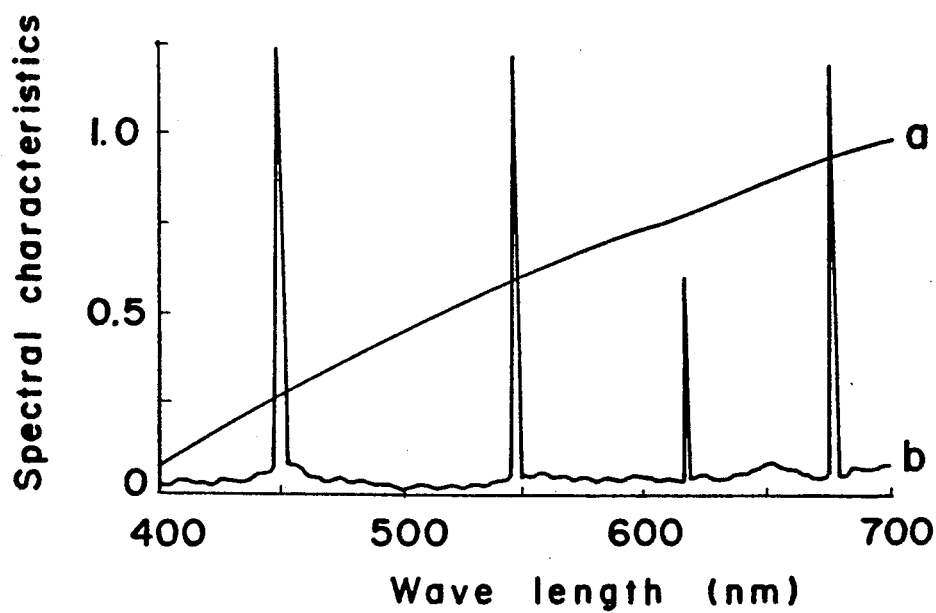
FIG. 3 is a graph which shows the spectral characteristics of the light sources.
Figures 4, 5:
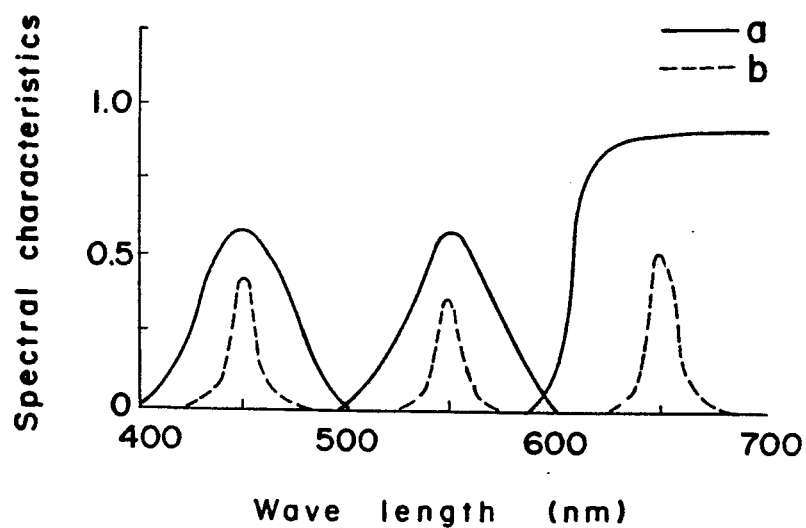
FIG. 4 is a graph which shows the spectral characteristics of the filters used for the optical systems.
FIG. 5 is a table which shows the respective picture image information written to the liquid crystal panel employed for the tests.

FIG. 2 shows the respective sensitivities of Y, M, C micro-capsules with respect to light wavelength. The curve 'a' in FIG. 3 shows the spectral characteristics of a conventional light source for exposure, and the curve 'a' in FIG. 4 shows the spectral characteristics of a filter which separates color from light (picture image informing light) for irradiating a media sheet.

As apparent from FIG. 2, the wavelength ranges to which the Y, M, C micro-capsules are sensitive are mutually overlapped (referred to as a cross talk range), so that the micro-capsules are also sensitive to light within other wavelength range to be cured. The Y micro-capsule, for example, is sensitive not only to light within the blue wavelength range of approximately 400 to 500 nm, but to light within the green wavelength range of approximately 500 to 600 nm. For this reason, the micro-capsules are excessively cured through the three times exposure, thereby resulting in the deterioration of color densities. For example, yellow is large in the amount of light within green wavelength range, so that the cured amount of the micro-capsules becomes large due to the presence of the cross talk portion. This leads to the remarkable deterioration in the densities of three primary colors.

In the conventional systems, the Y, M, and C micro-capsules on the media sheet have been exposed to the respective light within blue, green, and red wavelength ranges, not taking into account the sensitivities of the micro-capsules. This leads to excessive curing of the micro-capsules, resulting in the deterioration of color densities, and the turbidity in colors.

In the present invention, the exposure light is processed so that its wavelength range may not have cross talk sensitivity range of the Y, M, and C micro-capsules. Accordingly, when micro-capsules are exposed with the processed light, unnecessary curing of the micro-capsules does not occur.

Figure 6:
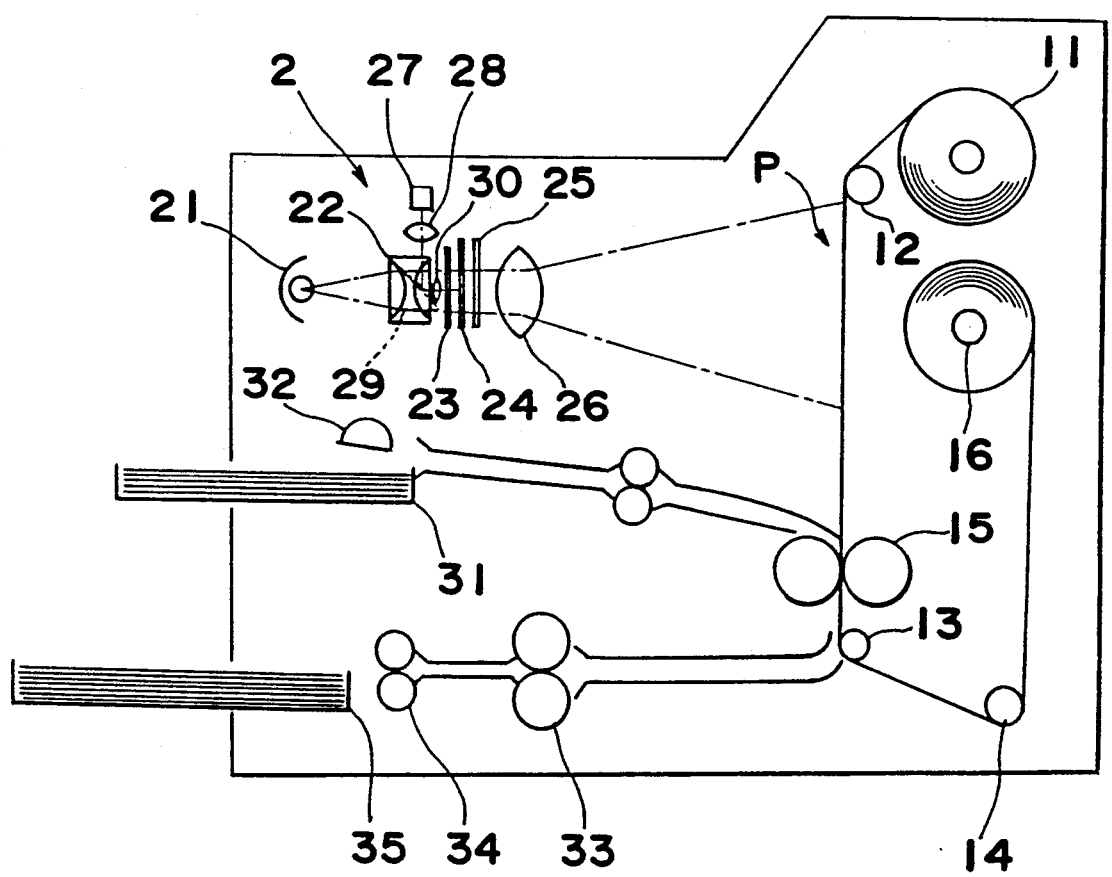
FIG. 6 is a schematic front view of the image forming apparatus.

FIG. 6 is a schematic front view of the copying machine embodying the present invention.

Referring to FIG. 6, a numeral 11 is a media sheet capable of corresponding to all kinds of colors. It is rolled around a spool, and is taken up onto a take-up spool 16 through guide rolls 12, 13, and 14, and a pair of pressure rolls 15. The media sheet 11 is exposed to picture image forming light at an exposing portion P. An optical system 2 is provided confronting the exposing portion P. The optical system 2 is provided with a light source 21, which emits light to irradiate the exposing portion P through a condenser lens 22, a liquid crystal panel 24, a filter 25, and an image forming lens 26. Picture image information is written to the liquid crystal panel 24 by means of a laser diode 27, and the light transmitted through the liquid crystal panel 24 irradiates the media sheet 11. A numeral 23 is a shutter which opens or closes as required.

FIG. 7 is a partial enlarged perspective view of the optical system 2 shown in FIG. 6.

Referring to FIG. 7, the liquid crystal panel 24 is composed of three liquid crystals 24a, 24b, and 24c. Picture image informations of yellow, magenta, and cyan are written to the three liquid crystals 24a, 24b, and 24c, respectively. The filter 25 is also composed of three filters 25a, 25b, and 25c. The liquid crystal panel 24 and the filter 25 are integrally supported by a base (not shown), and are controlled to precisely move toward the shown arrow direction A or B by a linear motor or linear encoder.

The laser diode 27 emits a laser beam according to the digital picture image information inputted from a computer or image scanner. This laser beam forms an image on the liquid crystal panel 24 through a collimator lens 28, a galvano mirror 29, and an image forming lens 30. Digital picture image information is composed of three primary color information such as yellow, magenta, and cyan. When each primary color image is formed with the use of a laser beam, the liquid crystal panel 24 is moved toward the arrow direction A or B, so that the primary color image information is written to the corresponding liquid crystal 24a, 24b, or 24c: the yellow picture image information is written to the liquid crystal 24a, the magenta picture image information to the liquid crystal 24b, and the cyan picture image information to the liquid crystal 24c. In addition, when picture image information is written to the liquid crystal by means of the laser diode 27, a scanning operation of laser beam along the direction y is carried out with the movement of the liquid crystal panel 24 toward the arrow direction A or B, and scanning operation along the direction z is carried out with the rotation of the galvano mirror 29.

After writing the picture image information, the liquid crystals 24a, 24b, and 24c are exposed to light from the light source 21, and the relevant light transmitted through each liquid crystal irradiates the media sheet on the exposing portion P. In this exposure, the media sheet is exposed to light first with interposing the liquid crystal 24a on the optical path between the light source 21 and the media sheet, next with interposing the liquid crystal 24b therebetween, and with interposing the liquid crystal 24c therebetween, in succession. In this period, the filter 25 is moved simultaneously with the movement of the liquid crystal 24 so that the liquid crystal 24a can correspond to the filter 25a, the liquid crystal 24b to the filter 25b, and the liquid crystal 24c to the filter 25c, and the respective combinations separately transmit the respective light within the blue, green, and red wavelength ranges. The three kinds of micro-capsules are respectively cured on the media sheet by the above mentioned three-stepped exposure, thereby forming latent images thereon.

Image receiving sheets are stored in the cassette provided on the left side wall of the body of the image forming apparatus. An image receiving sheet is fed by the rotation of the supply roll 32, and overlapped on the media sheet storing the latent image at the pressure rolls 15. The both sheets are pressed by the pressure rolls 15 to crush the uncured micro-capsules, so that the colorless dye flows from the crushed micro-capsules to reproduce a colored picture image on the image receiving sheet. This image receiving sheet is delivered to the tray 35 through a pair of heat rolls 33, and a pair of delivery rolls 34. In this connection, the coloring reaction of this image receiving sheet is accelerated by heat of the heat rolls, thereby improving the color densities of the reproduced picture images.

To form latent images with the use of the apparatus having the above mentioned construction, the light source 21 having the spectral characteristics 'a' or 'b' shown in FIG. 3 is employed. Specifically, the spectral characteristics 'a' is of a halogen tungsten lamp, and the spectral characteristics 'b' is of a metal halide lamp which can emit light has the emission spectrum of a metal as well as the emission spectrum of mercury by adding a metal halide in the tube of a mercury lamp. The added metal halide is vaporized by the discharge heat of the mercury. When the vaporized metal halide reaches the high temperature portion on the center of the arc in the tube, it is dissociated into the metal and the halogen, thereby emitting light having the emission spectrum of the metal. The dissociated metal and halogen are recombined with each other at an ambient temperature near the tube to be a metal halide, so that the quartz as the material of the tube is not corroded by the metal and the halogen. The metal halide to be added includes lithium iodide (LiI), thallium iodide (TlI), gallium iodide (GaI$_3$), zinc iodide (ZnI$_2$), and the like. The metal halide is added in such an amount as enables the metal halide lamp to emit light having an emission peak at each wavelength of 450 nm, 550 nm, 610 nm, or 670 nm, so that the intensity ratio of the respective emission peaks results in 2:2.5:1:1.5. In this connection, the metal halide lamp is driven serially at a discharge voltage of 85 v. In contrast with the sensitivity characteristics of the Y, M, and C micro-capsules as shown in FIG. 2, the respective wavelength ranges with the above mentioned emission peaks do not reach each wavelength range of the cross talks, and they are close to the emission peaks of the respective micro-capsules.

The filter used for forming latent images show the spectral transmission characteristics 'a' or 'b' as shown in FIG. 4. The filters having the spectral transmission characteristics 'a' have been conventionally employed, but they transmit light within a wavelength range including the cross talk range. The filters having the spectral transmission characteristics 'b' have wavelength ranges which do not reach the wavelength ranges of the respective cross talks of the Y, M, and C micro-capsules, and have the peaks of their transmission cross to the sensitivity peaks of the micro-capsules. In the present invention, preferable is a filter 'b' in which the half-value breadth is 20 nm or less.

The image forming apparatus of the present invention is constructed using a combination of the light source and the filter each having the above mentioned characteristics, and its image forming performance is tested. FIG. 5 shows the picture image information written to the liquid crystals 24a, 24b, and 24c employed in this test. The step wedge image stated in the table of FIG. 5 is defined as an image which is formed by varying the transmission density per a given area from 0.1 to 1.8.

Referring to the table of FIG. 5, when a latent image is formed on the conditions "1", first, light transmitted through a liquid crystal 24a and a filter 25a irradiates a media sheet 11. This light is within the blue wavelength range, and the Y micro-capsules on the media sheet 11 corresponding to this light are all cured because the picture image information have not been written to the liquid crystal 24a. Then, light transmitted through a liquid crystal 24b and a filter 25b irradiates the same area of the media sheet 11 as that having been exposed to the previous light, namely, light within the blue wavelength range, thereby curing all of the M micro-capsules on the media sheet 11. Further, light transmitted through a liquid crystal 24c and a filter 25c repeatedly irradiates the same area of the media sheet 11. In this exposure, since step wedge images have been written to the liquid crystal 24a, the C micro-capsules are cured partially on the media sheet 11 corresponding these step wedge images. Thus, the latent images have been formed on the media sheet 11, onto which an image receiving sheet is overlapped under pressure, so that cyan colored picture images are reproduced on the image receiving sheet.

Like the above mentioned latent image formation, latent images are respectively formed on the conditions '2', '3', and '4'. As a result, magenta colored picture images, yellow colored picture images, and grey colored picture images (their maximum densities are equivalent to black) are respectively reproduced on the image receiving sheet.

The picture image forming performance is tested on the conditions '1' to '4' with the use of the image forming apparatus employing a light source 21 having the characteristics 'a' or 'b' of FIG. 3, and filters 25a to 25c having the characteristics 'a' or 'b' of FIG. 4. The results are shown by the graphs in FIGS. 1(A) to 1(D). In these figures, the respective axes of abscissa represent the densities of the step wedge images written to the liquid crystals, and the respective axes of ordinate represent the densities of the reproduced images. Specifically, the density of a reproduced image is a reflection density measured with a macbeth densitometer: the respective curved lines of the graphs represent the densities of cyan, mazenta, yellow, and grey of the picture images reproduced on the conditions '1' to '4'.

Hereinafter, description is given to the combination of a light source and filters, and the exposure time, and the results thereof, with respect to the characteristics shown in FIGS. 1(A) to 1(D). In the respective combinations resulting the characteristics shown in FIGS. 1(A) to 1(C), the light source and the filters are selected so that the wavelength ranges of the picture image forming light may not reach the respective wavelength crosstalk ranges, while the characteristics shown in FIG. 1(D) are of the prior art in which the light source and the filters permit the wavelength range of the picture image informing light to include the respective wavelength cross talk ranges.

Figure 1:
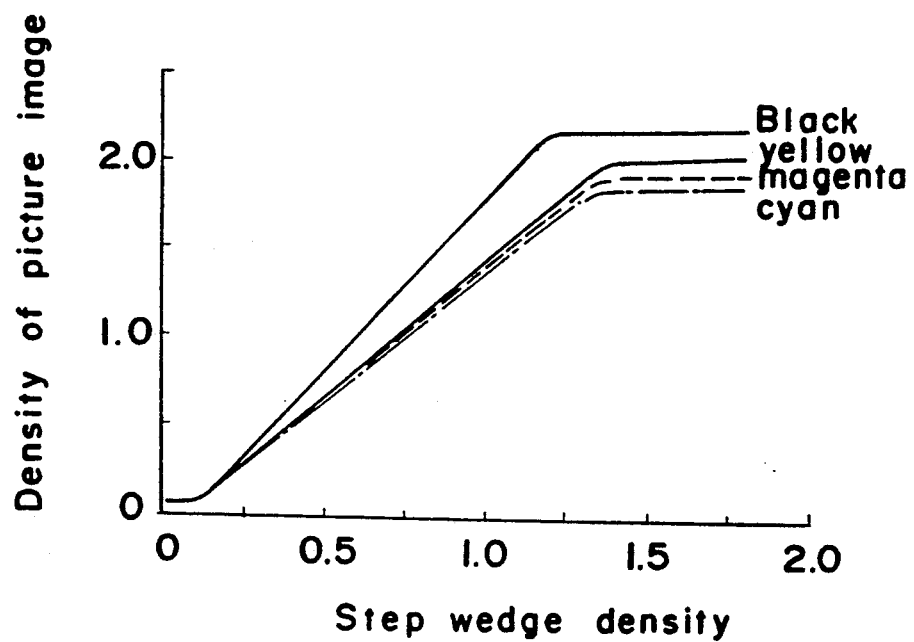
FIGS. 1(A–1(D) shows graphs of the characteristic curve of the picture qualities of the images reproduced through the exposure to picture image informing light, and the (A) to (C) 1 of this Fig. show the results of the present invention, and the (D) shows the result of the prior art.
Figure 1:
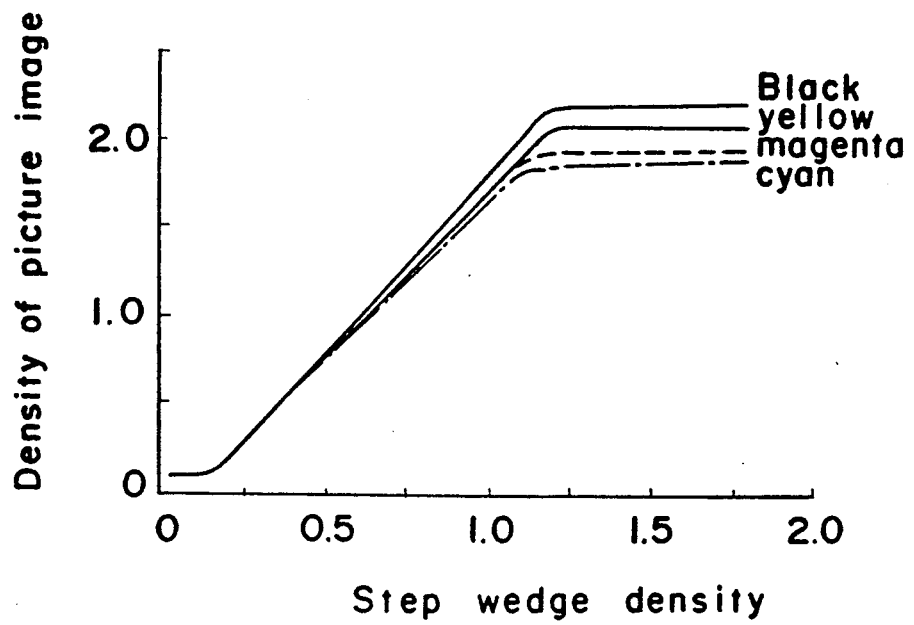
Figure 1:
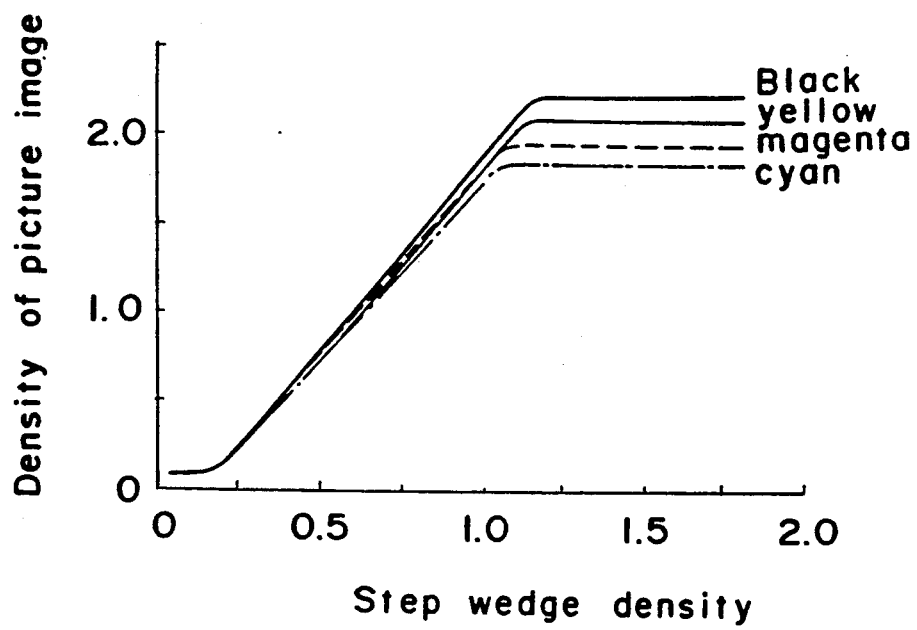
Figure 1:
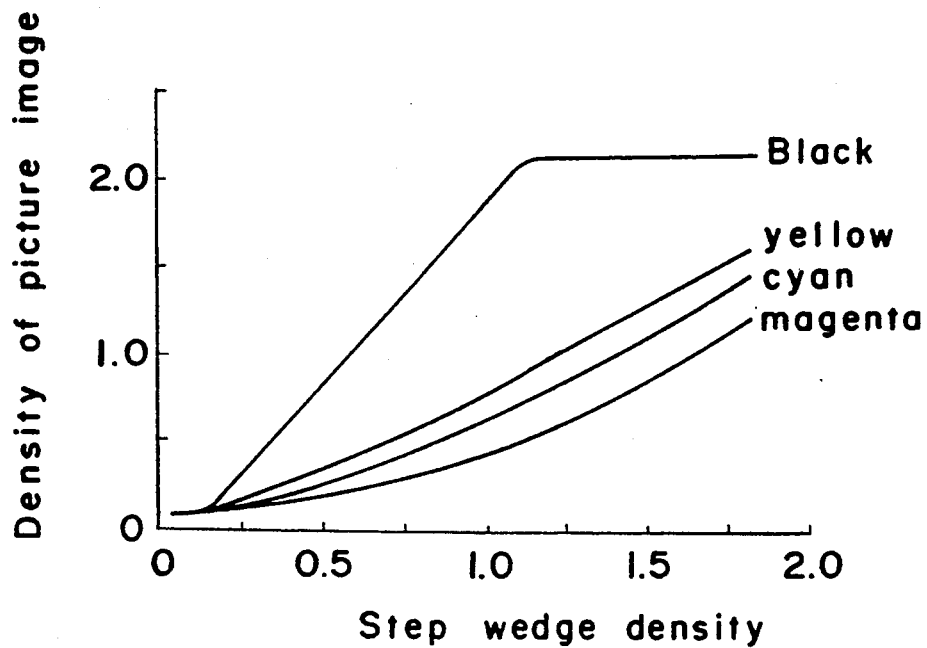

Referring to FIG. 1(D), it shows the density characteristics of images which is reproduced by the conventional image forming apparatus. This apparatus employs a halogen tungsten lamp as the light source 21 which has the spectral characteristics shown by 'a' in FIG. 3; and filters 25a to 25c having the spectral characteristics shown by 'a' in FIG. 4. As described before, this combination permits the wavelength ranges of the picture image forming light to include the respective cross talk wavelength ranges. The respective exposure time for the respective light within blue, green, and red wavelength ranges are set to 8.0 sec., 6.8 sec., and 5.8 sec.. This variation in exposure time is based on such consideration that the area to be cured in the media sheet can be sufficiently exposed to light, since light within the respective wavelength ranges are different in the light intensity. As apparent from FIG. 1(D), the maximum densities of the respective plain colors of cyan, mazenta, and yellow are lower than the maximum density of grey (i.e. black), and the respective gradients (gammas) of the curved lines representing the density variations are smaller than that of grey. These characteristics are remarkable particularly in magenta. This is because the M capsules have been excessively cured by the exposure to the respective light within blue and red wavelength ranges.

EXAMPLES

The present invention is illustrated by the following examples, which, however, are not to be constructed as limitting the scope of the present invention to their details.

EXAMPLE 1

Referring to FIG. 1(A), this example is according to the present invention, which employs, as a light source 21, a halogen tungsten lamp having the spectral characteristics shown by 'a' in FIG. 3, and filters 25a to 25c having the spectral characteristics shown by 'b' in FIG. 4. Using this example, a media sheet is exposed to picture image informing light. The exposure time of the respective light within blue, green, and red wavelength ranges are set to 25.0 sec., 12.8 sec., and 10.8 sec.. As apparent is from FIG. 1(A), the maximum density and gamma of each plain color is close to the characteristic curve of grey, by which improvement on the density characteristics can be assured.

EXAMPLE 2

Referring to FIG. 1(B), this example employs, as a light source 21, a metal halide lamp having the spectral characteristics shown by 'b' in FIG. 3, and filters 25a to 25c having the spectral characteristics shown by 'a' in FIG. 4. Using this example, a media sheet is exposed to picture image forming light. The exposure time of the respective light within blue, green, and red wavelength ranges are set to 2.5 sec., 3.8 sec., and 4.8 sec.. As apparent is from FIG. 1(B), the maximum density and gamma of each plain color is close to the characteristic curve of grey, by which improvement on the density characteristics can be assured. Furthermore, the emission peaks of the metal halide lamp closely conform to the sensitivity peaks of the Y, M, and C micro-capsules, which improves the utilization of light, thereby saving the exposure time. Therefore, the picture images can be reproduced in shorter time.

EXAMPLE 3

Referring to FIG. 1(C), this example employs, as a light source 21, a metal halide lamp having the spectral characteristics shown by 'b' in FIG. 3, filters 25a and 25b having the spectral characteristics shown by 'b' in FIG. 4, and a filter 25c having the spectral characteristics shown by 'a' in FIG. 4 which is employed because the emission spectrum of the light source does not conform to the transmisson wavelength of the filter characterized by 'b' in FIG. 4. Using this example, a media sheet is exposed to picture image forming light. The exposure time of the respective light within blue, green, and red wavelength ranges are set to 3.0 sec., 3.9 sec., and 5.8 sec.. As is apparent from FIG. 1(C), this example is improved most effectively because the respective micro-capsules have been accurately cured by exposure to light from the light source of this example. This can be assured by the characteristic curve of each plain color which is closely overlapped on the characteristic curve of grey. In the example 1, the combination of the halogen tungsten lamp and the filters transmitting light within a narrow wavelength range wastes a large amount of light, which requires longer time to expose the media sheet, while in this example, the emission characteristics of the metal halide lamp show a narrow wavelength range, and the peak intensity thereof is large, which enables excellent picture images to be reproduced in shorter time than the conventional picture image forming apparatus.

As have been described above, the present invention can prevent the deterioration in the density of each primary color of yellow, magenta, and cyan of the reproduced images. In addition, the characteristic curve of each primary color can be more close to the characteristic curve of grey. Owing to these merits, the present invention can accurately reproduce color without any turbidity, with the simplified digitized image processing technique.

What is claimed is:

1. A digital picture image forming apparatus comprising:
   (a) a media sheet coated with micro-capsules, each of which contains one of the dyes capable of coloring yellow, magenta and cyan, each one being cured by irradiating one of blue, green and red light;
   (b) an optical system, including a metal halide light source, for irradiating to said media sheet a blue, green and red light, containing digital picture information, to form latent images on said media sheet;
   (c) means for pressing an image receiving sheet on said irradiated media sheet and rupturing the uncured micro-capsules to form picture image information on the image receiving sheet, wherein said red, green and blue light, containing digital picture image information, contains only non-overlapping cross talk wavelength ranges, due to said metal halide light source producing light having narrow wavelength ranges.

2. The digital picture image forming apparatus of claim 1, wherein said metal halide light source includes a metal halide selected from the group consisting of lithium iodide (LiI), thallium iodide (TlI), gallium iodide ($GaI_3$) and zinc iodide (ZnI).

3. The digital picture image forming apparatus of claim 1 wherein said metal halide light source produces light having a wavelength of 450 nm, 550 nm, 610 nm and 670 nm.

4. The digital picture image forming apparatus of claim 1 wherein said metal halide lamp is serially driven.

5. The digital picture image forming apparatus of claim 1 further comprising:
   a color filter, arranged between said metal halide light source and said media sheet, containing a plurality of elements each with peak transmission characteristics correlating to sensitivity peaks of one of the micro-capsules and containing a half-value breath of 20 nm or less to thereby further prevent cross talk.

* * * * *